United States Patent
Yoshida et al.

[11] Patent Number: 6,138,510
[45] Date of Patent: *Oct. 31, 2000

[54] PIEZOELECTRIC VIBRATORY GYROSCOPE UTILIZING AN ENERGY-TRAPPING VIBRATION MODE

[75] Inventors: Tetsuo Yoshida; Naoki Wakou; Hiroshi Abe, all of Sendai; Hiroshi Watanabe, Iwaki, all of Japan

[73] Assignee: Tokin Corporation, Miyagi, Japan

[*] Notice: This patent is subject to a terminal disclaimer.

[21] Appl. No.: 09/217,561

[22] Filed: Dec. 21, 1998

Related U.S. Application Data

[62] Division of application No. 08/878,409, Jun. 18, 1997, Pat. No. 5,887,480.

[30] Foreign Application Priority Data

Jun. 20, 1996 [JP] Japan ................................. 8-159467
Jun. 20, 1996 [JP] Japan ................................. 8-159470
Jun. 28, 1996 [JP] Japan ................................. 8-168924
Jun. 28, 1996 [JP] Japan ................................. 8-168926
Aug. 2, 1996 [JP] Japan ................................. 8-204947

[51] Int. Cl.$^7$ ................................................. G01P 9/04
[52] U.S. Cl. ........................... 73/504.02; 73/504.04; 310/320; 310/366
[58] Field of Search .................. 73/504.02, 504.04, 73/504.12, 504.16; 310/320, 358, 366

[56] References Cited

U.S. PATENT DOCUMENTS

| | | | |
|---|---|---|---|
| 4,489,609 | 12/1984 | Burdess | 73/505 |
| 5,057,801 | 10/1991 | Kittaka et al. | 333/191 |
| 5,084,647 | 1/1992 | Inoue et al. | 310/320 |
| 5,532,542 | 7/1996 | Yoshida et al. | 310/348 |
| 5,604,310 | 2/1997 | Nakamura | 73/504.12 |
| 5,675,208 | 10/1997 | Huang et al. | 310/320 |
| 5,815,053 | 9/1998 | Futakuchi | 310/326 |
| 5,887,480 | 3/1999 | Yoshida et al. | 73/504.02 |

FOREIGN PATENT DOCUMENTS 27 31 558  1/1979  Germany .

OTHER PUBLICATIONS

Electronics & Communications in Japan, Part II–Electronics, vol. 79, No. 7, Jul., 1996, pp. 30–39, K. Nakamura, Elastic Wave Enery–Trapping and its Application to Piezoelectrc Devices.

*Primary Examiner*—Helen Kwok
*Attorney, Agent, or Firm*—Frishauf, Holtz, Goodman, Langer & Chick, P.C.

[57] ABSTRACT

A piezoelectric vibratory gyroscope utilizing an energy-trapping vibration mode comprises a piezo-electric plate having a principal surface and polarized in a thickness direction, and first through n-th electrodes (n being an integer not smaller than three) formed in a generally central area of the principal surface at positions corresponding to first through n-th vertexes of a polygon having n angles. When the piezoelectric plate is excited in the energy-trapping vibration mode of a primary vibration, rotation of the piezoelectric plate around an axis perpendicular to the principal surface of said piezoelectric plate produces the Coriolis force to excite a secondary vibration which induces electric voltages at the first through the n-th electrodes. A voltage difference is detected for at least two of the first through the n-th electrodes.

15 Claims, 5 Drawing Sheets

PIEZOELECTRIC VIBRATORY GYROSCOPE UTILIZING AN ENERGY-TRAPPING VIBRATION MODE

This is a division of U.S. application Ser. No. 08/878,409 filed Jun. 18, 1997, U.S. Pat. No. 5,887,480.

BACKGROUND OF THE INVENTION

This invention relates to a gyroscope for detecting rotational angular velocity and, in particular, to a piezoelectric vibratory gyroscope comprising a piezoelectric vibrator vibrating in an energy-trapping vibration mode.

In the prior art, the gyroscope has often be used in direction sensors for car navigation systems and vibration sensors in image stabilizing systems for camcorders.

A piezoelectric vibratory gyroscope utilizes a mechanical phenomenon relating to Coriolis force. Specifically, when an object vibrating in a vibrating direction is subjected to a rotational angular velocity, the Coriolis force is produced in a direction perpendicular to the vibrating direction.

In a composite piezoelectric vibration system in which vibration can be excited in first and second directions perpendicular to each other, it is assumed that a piezoelectric vibrator is rotated while the vibration is excited in the first direction. In this event, the above-mentioned Coriolis force is produced in the second direction perpendicular to the first direction to excite the vibration in the second direction. By piezoelectric effect, the vibration in the second direction causes an electromotive force to produce an output voltage. It is noted here that the amplitude of the vibration in the second direction is proportional to an amplitude of the vibration in the first direction and the rotational angular velocity. If the amplitude of the vibration in the first direction is kept constant, the rotational angular velocity applied to the piezoelectric vibrator can be calculated from the output voltage.

A conventional structure of the piezoelectric vibratory gyroscope of a type described utilizes a bending vibration mode of the piezoelectric vibrator comprising a rectangular metal beam as a vibrating body and piezoelectric vibrating elements mounted on different surfaces of the vibrating body. The piezoelectric vibrator must be supported or fixed at nodal points of the vibration. Further, driving and detecting circuits must be connected to electrodes of the piezoelectric vibrating elements by the use of lead wires. Since the connection of lead wires affects the properties of the gyroscope, it is difficult to stably produce gyroscopes with constant characteristics. Furthermore, the piezoelectric vibrator must be supported by a holder and mounted on a substrate which is provided with the driving and detecting circuits thereon. With this structure, it is difficult to reduce the size and the thickness of the piezoelectric vibratory gyroscope.

On the other hand, a piezoelectric vibrator carrying out energy-trapping vibration is extensively used in an intermediate-frequency filter for a FM radio or a television. In the energy-trapping vibration, vibration energy is concentrated to the neighborhood of a driving electrode. The energy-trapping vibration includes various vibration modes such as extensional or shear vibration in either a thickness direction or a widthwise direction of a piezoelectric plate. It is noted here that the extensional vibration in the thickness direction is a vibration mode such that both the propagating direction of the vibration and the displacement by the vibration are parallel to the thickness direction of the piezoelectric plate. On the other hand, the shear vibration in the thickness direction is a vibration mode such that the propagating direction is parallel to the thickness direction while the displacement is perpendicular to the propagating direction. In the following, the latter may be briefly called the thickness-shear vibration. In the piezoelectric vibrator described above, a lead terminal can be formed at a desired position without being influenced by a support structure.

Accordingly, if the above-mentioned piezoelectric vibrator used in the intermediate-frequency filter can be applied to the piezoelectric vibratory gyroscope instead of the piezoelectric vibrator having the beam vibrating body, the above-mentioned disadvantages will be removed.

SUMMARY OF THE INVENTION

It is an object of this invention to provide a piezoelectric vibratory gyroscope in which a piezoelectric vibrator has a simple structure and lead wires are not used as input/output connections.

It is another object of this invention to provide a piezoelectric vibratory gyroscope in which a driving circuit for driving a piezoelectric vibrator and a detecting circuit for detecting an output of the piezoelectric vibrator are formed on a substrate on which the piezoelectric vibrator is also mounted.

It is still another object of this invention to provide a piezoelectric vibratory gyroscope which is small in size and thickness.

It is yet another object of this invention to provide a piezoelectric vibratory gyroscope in which characteristic fluctuation depending upon a support structure is suppressed.

According to this invention, there is provided a piezoelectric vibratory gyroscope utilizing an energy-trapping vibration mode, which comprises a piezoelectric plate having a principal surface and polarized in a thickness direction, driving electrode means formed on the piezoelectric plate for receiving an exciting voltage to excite the energy-trapping vibration of the piezoelectric plate, output electrode means formed on the principal surface for detecting an output voltage induced by the Coriolis force caused by rotation of the piezoelectric plate around an axis perpendicular to the principal surface of the piezoelectric plate during when the energy-trapping vibration of the piezoelectric plate is being excited, and first through n-th electrodes, n being an integer not smaller than three, formed in a generally central area of the principal surface at positions corresponding to first through n-th vertexes of a polygon having n angles, the first through n-th electrodes providing the output electrode means.

Preferably, the integer n is equal to three or four.

Preferably, the piezoelectric plate is made of a piezoelectric ceramics material and is polarized in a thickness direction thereof only in the neighborhood of a region where the first through the n-th electrodes are formed.

DESCRIPTION OF THE PREFERRED EMBODIMENTS

Figure 1:
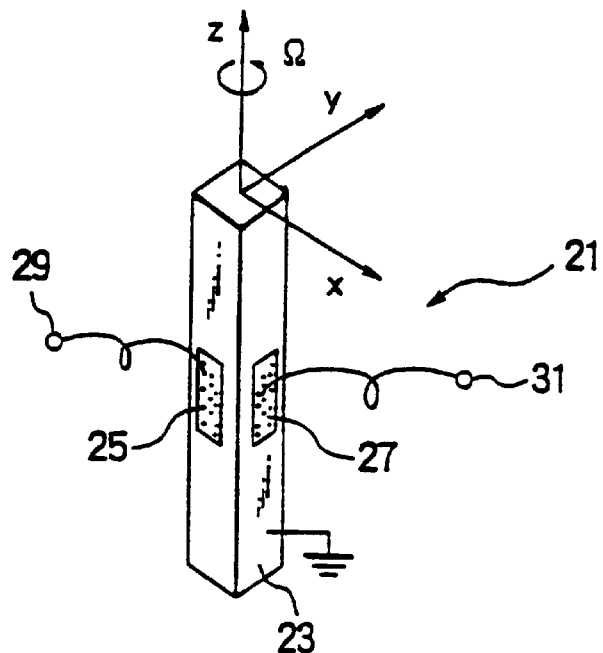
FIG. 1 is a perspective view of a conventional piezoelectric vibratory gyroscope.
Figure 2A:
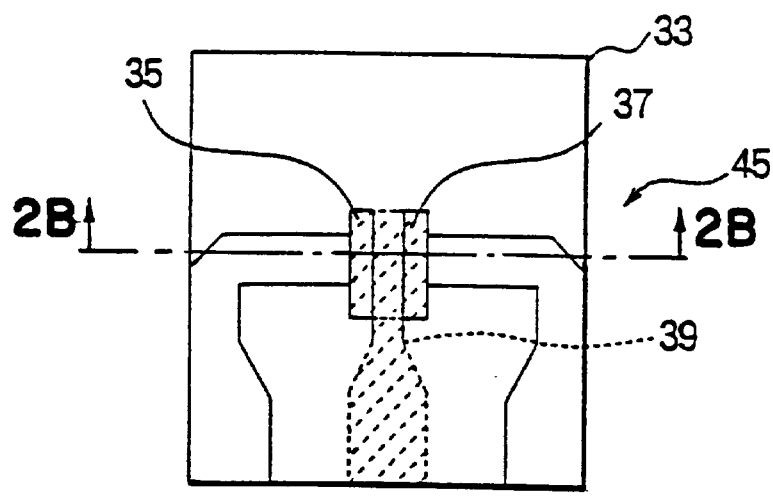
FIGS. 2A is a plan view of a conventional energy-trapping vibrator.
Figure 2B:
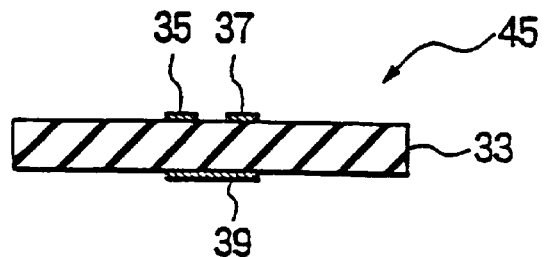
FIGS. 2B is a sectional view taken along a line 2B—2B in FIG. 2A but omitting portions which do not serve as electrodes but serve as leads.
Figure 3:
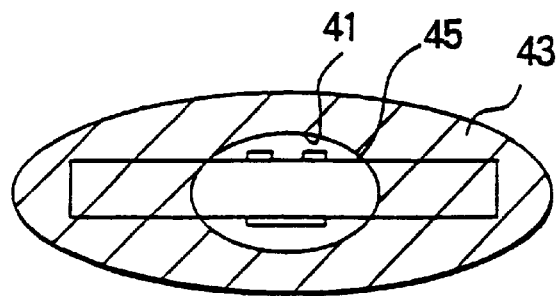
FIG. 3 is a side view showing a support structure of the energy-trapping vibrator in FIG. 2A.

In order to facilitate an understanding of this invention, description will at first be made about a conventional piezoelectric vibratory gyroscope with reference to FIGS. 1 through 3.

Referring to FIG. 1, the piezoelectric vibratory gyroscope depicted at 21 comprises a metal beam body 23 having a square section, and first and second piezoelectric vibrating elements 25 and 27 bonded to two adjacent surfaces of the metal beam body 23 at their approximate center regions, respectively. Each of the first and second piezoelectric vibrating elements 25 and 27 comprises piezoelectric ceramics thin plate polarized in a thickness direction, electrodes formed on opposite surfaces thereof, and lead wire 29 and 31 connected to one of the electrodes of the piezoelectric ceramics thin plate 25 and 27. A combination of the metal beam body 23 and the first and the second piezoelectric vibrating elements 25 and 27 forms a beam vibrator.

As known in the art, the metal beam body 23 of a square section has first and second bending vibration modes having first and second vibrating directions perpendicular to each other. The first and the second bending vibration modes have resonant frequencies substantially equal to each other as far as the metal beam body 23 is made of a homogeneous metal material. Accordingly, if the first piezoelectric vibrating element 25 is applied with an excitation voltage having a frequency substantially equal to the above-mentioned resonant frequencies of the metal beam body 23, the metal beam body 23 vibrates in a y-axis direction as a primary bending vibration to wave the surface thereof to which the first piezoelectric vibrating element 25 is bonded. In this state, the metal beam body 23 is rotated at a rotational angular velocity (Ω) around a z-axis direction parallel to a longitudinal direction of the metal beam body 23. Then, by the action of Coriolis force, the metal beam body 23 is also vibrates as a secondary bending vibration in an x-axis direction to wave the surface to which the second piezoelectric vibrating element 27 is bonded. As a consequence, an electric voltage is produced across the electrodes of the second piezoelectric vibrating element 27 under a piezoelectric effect. The amplitude of the electric voltage thus produced is proportional to the amplitude of the primary bending vibration excited by the first piezoelectric vibrating element 25 and the rotational angular velocity applied to rotate the metal beam body 23.

Therefore, if the excitation effective voltage applied to the first piezoelectric vibrating element 25 is constant, the effective voltage produced in the second piezoelectric vibrating element 27 is proportional to the rotational angular velocity of the metal beam body 23.

Referring to FIGS. 2A and 2B, a piezoelectric vibrator 45 carrying out energy-trapping vibration is extensively used in an intermediate-frequency filter of an FM radio or a television. The energy-trapping vibration is a vibration mode in which vibration energy is concentrated to the neighborhood of driving electrodes and includes various vibration modes such as extensional or shear vibration in either a thickness direction or a widthwise direction of a piezoelectric plate 33.

By way of example, it is assumed that the piezoelectric plate 33 has a size of 6 mm×6 mm and a thickness of 0.2 mm. The driving electrodes 35, 37, and 39 are formed on the piezoelectric plate 33 within an approximate center region having a diameter of 1.5 mm. Thus, a 10.7 MHz ceramics filter for an FM radio is obtained. As illustrated in FIG. 3, a hollow portion 41 is formed on both surfaces of the piezoelectric plate 33 within a region having a diameter of about 3 mm around the driving electrodes 35, 37, and 39 while the remaining portion is fixed by a resin layer 43. With this structure, vibrator characteristics are not substantially affected. This is because, in the energy-trapping vibration, vibration energy is concentrated to the neighborhood of the driving electrode as described above. Thus, in the piezoelectric vibrator 45, lead terminals can be formed at any desired positions and no influence is caused by the support structure.

Now, description will be made about this invention in conjunction with several preferred embodiments thereof.

Figure 4:
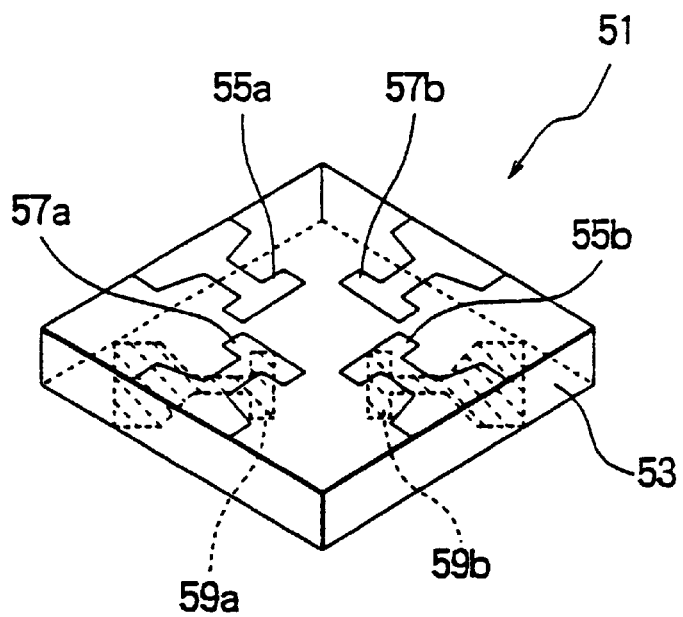
FIG. 4 is a perspective view of an energy-trapping vibrator of a piezoelectric vibrating gyroscope according to a first embodiment of this invention.

Referring to FIG. 4, a piezoelectric vibrator 51 of a piezoelectric vibratory gyroscope utilizing an energy-trapping vibration mode according to a first embodiment of this invention comprises a piezoelectric plate 53 polarized in a thickness direction. On one principal surface of the piezoelectric plate 53, a first pair of electrodes 55a and 55b are formed at an approximate center thereof to be opposite to each other with a predetermined space therebetween. Likewise, a second pair of electrodes 57a and 57b are formed opposite to each other at positions angularly offset by 90° from the first pair of electrodes 55a and 55b. On the other principal surface of the piezoelectric plate 53, a third pair of electrodes 59a and 59b are formed at a portion corresponding to a region in which the first pair of electrodes 55a and 55b and the second pair of electrodes 57a and 57b are formed. Specifically, the third pair of electrodes 59a and 59b are formed opposite to each other at positions angularly offset by 45° from the first pair of electrodes 55a and 55b, as depicted by broken lines in the figure.

As will later be described in detail, an a.c. voltage as an excitation voltage is applied between the third pair of electrodes 59a and 59b. The excitation voltage has a frequency substantially equal to a resonant frequency of the piezoelectric plate 53 in a shear mode in a thickness direction (hereinafter shortly called thickness-shear mode) of the piezoelectric plate 53. In this event, in a region between the third pair of electrodes 59a and 59b, primary thickness-shear vibration in an energy-trapping vibration mode is produced in a direction along which the third pair of electrodes 59a and 59b are faced to each other. In this state, the piezoelectric plate 53 is rotated around an axis perpendicular to the principal surfaces. Then, by the action of Coriolis force, secondary thickness-shear vibration is produced in a direction perpendicular to that of the primary thickness-shear vibration already excited. The secondary thickness-shear vibration produced by the Coriolis force induces first and second electric voltage potential differences between the first pair of electrodes 55a and 55b and between the second pair of electrodes 57a and 57b, respectively. The first and the second electric voltage potential differences have a common amplitude and different phases 180° shifted from each other. This is because the first and the second electrode pairs are angularly offset by ±45° with respect to the direction of the primary thickness-shear vibration, respectively.

Therefore, by detecting a differential voltage between the first and the second electric voltage potential differences and by subjecting the differential voltage to synchronous detection, an output voltage proportional to the rotational angular velocity can be obtained.

In the first embodiment, it is important to excite pure energy-trapping vibration without any spurious vibration in the region where each pair of electrodes are faced to each other. Particularly, if the piezoelectric plate 53 comprises a piezoelectric ceramics material, the above-mentioned object is attained by polarizing in a thickness direction only the neighborhood of the region where each of the first through the third pairs of electrodes are formed.

Next referring to FIGS. 5A, 5B, and 6, the principle of the energy-trapping vibration will be described by the use of a piezoelectric vibrator of a simple structure.

Figure 5A:
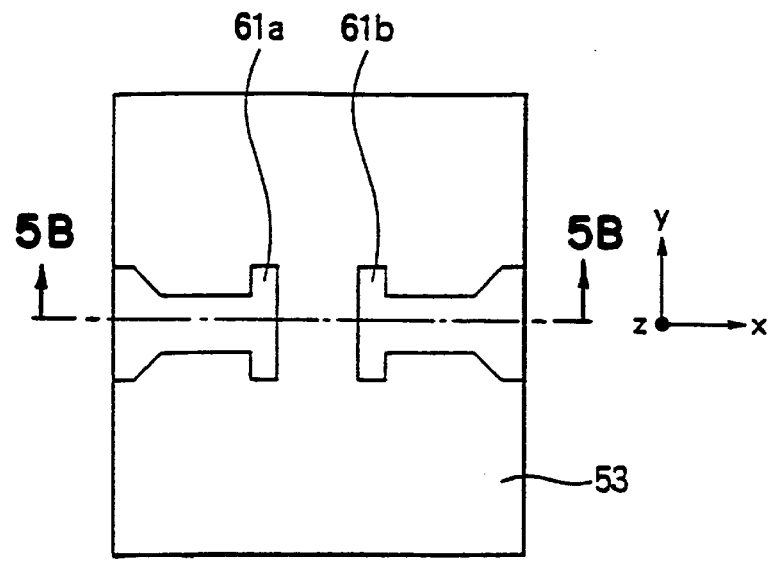
FIG. 5A is a plan view for describing the principle of energy-trapping vibration in a parallel-field-excitation thickness-shear vibration mode.
Figure 5B:
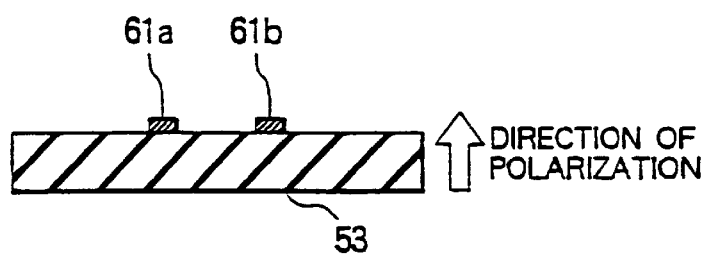
FIG. 5B is a sectional view taken along a line 5B—5B in FIG. 5A but omitting portions which do not serve as electrodes but serve as leads.

Referring to FIGS. 5A and 5B, the piezoelectric vibrator has partial electrodes 61a and 61b formed at a center region of one principal surface of the piezoelectric plate 53 polarized in the thickness direction or a z-axis direction. The partial electrodes 61a and 61b are faced to each other in an x-axis direction. A portion between the partial electrodes 61a and 61b is applied with an electric field substantially parallel to the one principal surface of the piezoelectric plate 53. The sizes of the partial electrodes 61a and 61b are appropriately designed in dependence upon the characteristics of a piezoelectric material of the piezoelectric plate 53. By the interaction between the electric field and the polarization in the thickness direction perpendicular to the electric field, energy-trapping vibration in a thickness-shear vibration mode is excited in the above-mentioned portion by parallel electric field.

Figure 6:
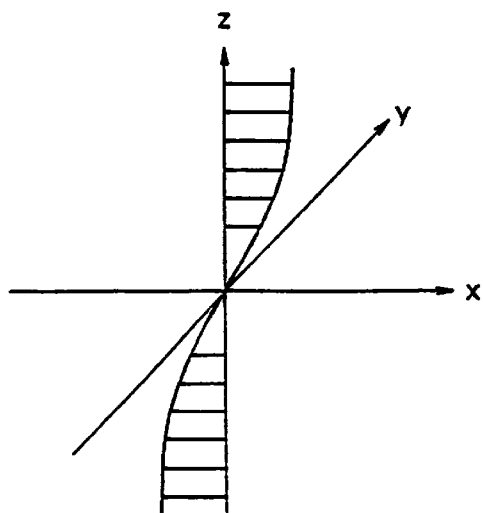
FIG. 6 is a view for describing displacement distribution in the energy-trapping vibration described in conjunction with FIGS. 5A and 5B.

Referring to FIG. 6, displacement distribution in the thickness direction is shown in case where resonance is caused at a half wavelength of the piezoelectric vibrator in FIGS. 5A and 5B. An x axis, a y axis, and a z axis in FIG. 6 correspond to the x-axis, the y-axis, and the z-axis directions in FIG. 5A, respectively. In the thickness-shear vibration, the propagating direction is parallel to the thickness direction while the displacement is perpendicular to the propagating direction, i.e., the displacement is parallel to the surface of the piezoelectric plate 53.

The piezoelectric vibratory gyroscope according to the first embodiment described above has various advantages. Specifically, the piezoelectric vibratory gyroscope is simple in structure and therefore small in size. Input and output terminals can be connected without using a lead wire. Gyro characteristics are substantially free from influence of the support and fixing structure. Secure and reliable support is insured and antivibration and antishock characteristics are excellent. In addition, since driving and detecting circuits of the piezoelectric vibratory gyroscope can be formed on the same substrate where the piezoelectric vibrator is formed. Therefore, the piezoelectric vibratory gyroscope is further reduced in size and in thickness.

Next, a second embodiment of this invention will be described.

Figure 7:
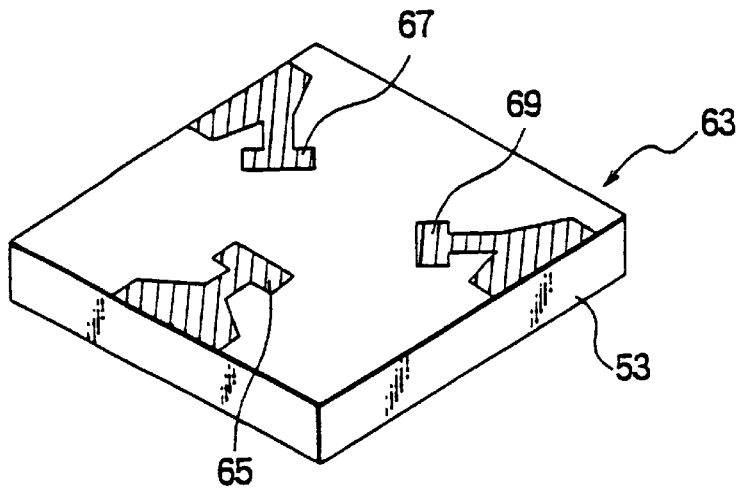
FIG. 7 is a perspective view of an energy-trapping vibrator of a piezoelectric vibratory gyroscope according to a second embodiment of this invention.

Referring to FIG. 7, a piezoelectric vibrator 63 of a piezoelectric vibratory gyroscope utilizing an energy-trapping vibration mode according to the second embodiment has first through third electrodes 65, 67, and 69 formed at an approximate center of one principal surface of the piezoelectric plate 53 polarized in the thickness direction. The first through the third electrodes 65, 67, and 69 are formed at positions corresponding to vertexes of an isosceles triangle.

Figure 8:
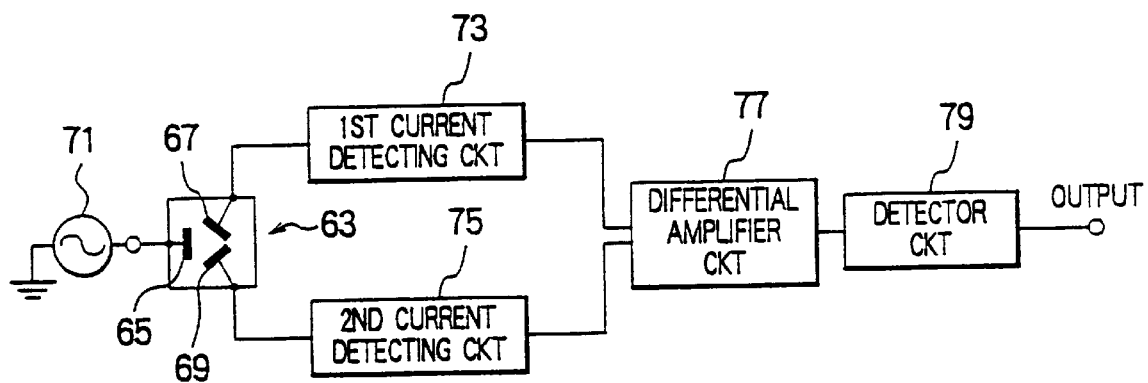
FIG. 8 is a block diagram of an electric circuit connected to the piezoelectric vibrator in FIG. 7.

Referring to FIG. 8, the piezoelectric vibrator 63 is connected to an electric circuit illustrated in the figure. Specifically, the first electrode 65 is connected to an a.c. power supply 71. The second and the third electrodes 67 and 69 are connected to input ports of first and second current detection circuits 73 and 75, respectively. The first and the second current detection circuits 73 and 75 have output ports connected to a differential amplifier circuit 77. The differential amplifier 77 is connected to a detector circuit 79 for producing a sensor output of the piezoelectric vibratory gyroscope.

Figure 9:
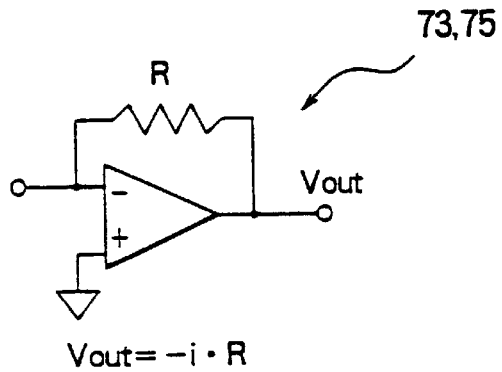
FIG. 9 is a circuit diagram of each current detecting circuit in the electric circuit illustrated in FIG. 8.

As illustrated in FIG. 9, each of the first and the second current detection circuits 73 and 75 connected to the piezoelectric vibrator 63 in FIG. 7 has a virtual grounding function. Each of the first and the second current detection circuits 73 and 75 has a function such that an input impedance is substantially equal to zero and an output voltage is proportional to an input current.

The principle of operation of the piezoelectric vibrator 63 according to the second embodiment is similar to that described in conjunction with the first embodiment and will not be described any longer.

Turning back to FIG. 7, the first electrode 65 is arranged at a position corresponding to a top angle of the isosceles triangle while the second and the third electrodes 67 and 69 are arranged at positions corresponding to base angles. The second and the third electrodes 67 and 69 are connected to the first and the second current detection circuits 73 and 75 having the virtual grounding function, respectively. Thus, the second and the third electrodes 67 and 69 are connected to virtual grounding circuits and serve as ground terminals in their potential.

When the first electrode 65 is applied with a driving voltage as an excitation voltage having a frequency substantially equal to a resonant frequency of the piezoelectric plate 53 in the thickness-shear vibration mode, primary thickness-shear vibration in the energy-trapping vibration mode is caused in a region surrounded by the first, the second, and the third electrodes 65, 67, and 69 along a straight line connecting the center of the first electrode 65 and a midpoint between the centers of the second and the third electrodes 67 and 69. In this state, the piezoelectric plate 53 is rotated around an axis perpendicular to the principal surfaces thereof. Then, by the action of Coriolis force, secondary thickness-shear vibration is caused in a direction perpendicular to the primary thickness-shear vibration. The secondary thickness-shear vibration changes the impedances between the first and the second electrodes 65 and 67 and between the first and the third electrodes 65 and 69. As a result, electric current supplied to each of the first and the second current detection circuits 73 and 75 is changed in level.

It is noted here that the second and the third electrodes 67 and 69 are symmetrically arranged with respect to the direction of the primary thickness-shear vibration. Therefore, the electric currents flowing into the first and the second current detection circuits 73 and 75, respectively, are equal to each other in amplitude and different in phase by 180° from each other.

Therefore, output voltages of the first and the second current detection circuits 73 and 75 are equal in amplitude and different in phase by 180° from each other. A differential voltage between the output voltages is detected and subjected to synchronous detection at a predetermined timing. Thus, an output voltage proportional to the rotational angular velocity applied to the piezoelectric vibrator 63 can be obtained.

In the second embodiment also, it is important to excite pure energy-trapping vibration without any spurious vibration in the region where the electrodes are faced to one another. This is attained by polarizing in a thickness direction only the neighborhood of the region of the piezoelectric plate 53 where the first through the third electrodes 65, 67, and 69 are formed, if the piezoelectric plate 53 is made of a piezoelectric ceramics material.

The piezoelectric vibratory gyroscope according to the second embodiment described above has various advantages. Specifically, the piezoelectric vibratory gyroscope is simple in structure and therefore small in size. Input and output terminals can be connected without using lead wires. Gyro characteristics are substantially free from influence of the support and fixing structure. Secure support is assured and antivibration and antishock characteristics are excellent.

Next, description will be made about a third embodiment of this invention.

Figure 10:
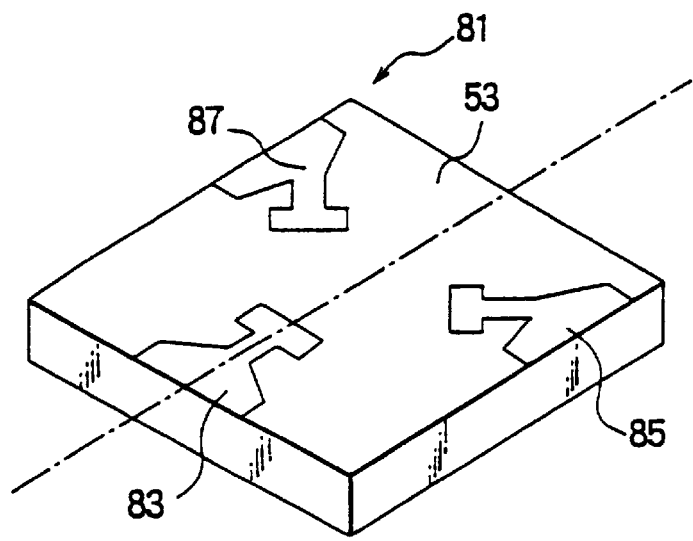
FIG. 10 is a perspective view of an energy-trapping vibrator of a piezoelectric vibratory gyroscope according to a third embodiment of this invention.

Referring to FIG. 10, a piezoelectric vibrator 81 of a piezoelectric vibratory gyroscope utilizing an energy-trapping vibration mode according to the third embodiment has first through third electrodes 83, 85, and 87 formed at an approximate center of one principal surface of the piezoelectric plate 53 polarized its thickness direction. The first through the third electrodes 83, 85, and 87 are formed at positions corresponding to vertexes of an isosceles triangle.

Figure 11:
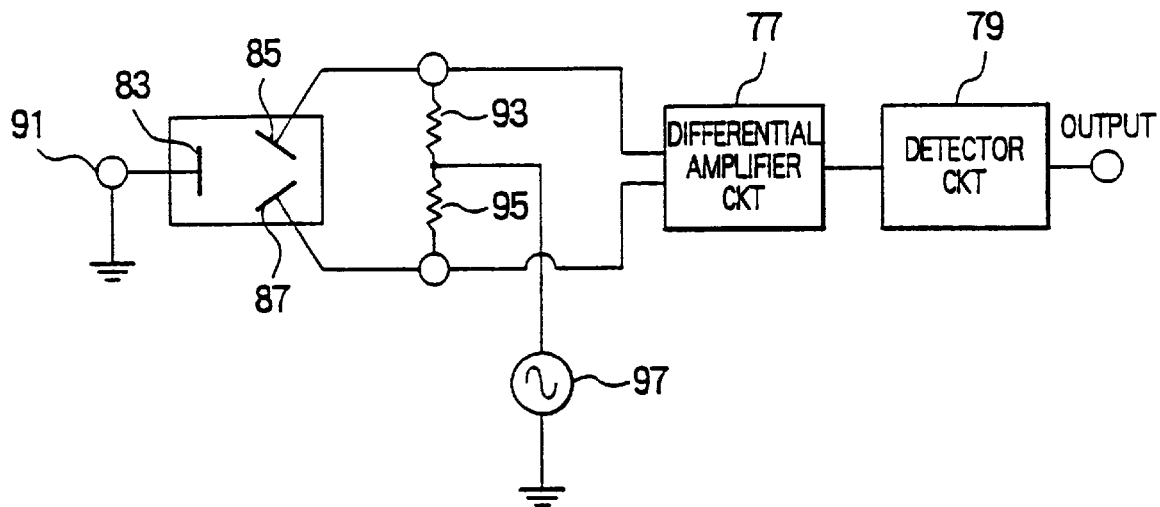
FIG. 11 is a block diagram of an electric circuit connected to the piezoelectric vibrator in FIG. 10.

Referring to FIG. 11, the piezoelectric vibrator 81 is connected to an electric circuit illustrated in the figure. Specifically, the first electrode 83 is connected to a ground terminal 91 while the second and the third electrodes 85 and 87 are connected to an a.c. power supply 97 through resistors 93 and 95, respectively. The second and the third electrodes 85 and 87 are also connected to input ports of a differential amplifier circuit 77. The differential amplifier circuit 77 has an output port connected to a detection circuit 79 for producing a sensor output of the piezoelectric vibratory gyroscope.

The operation principle of the piezoelectric vibrator according to the third embodiment is similar to that described in conjunction with the first embodiment and will not be described any longer.

Turning back to FIG. 10, the first electrode 83 is arranged at a position corresponding to a top angle of the isosceles triangle while the second and the third electrodes 85 and 87 are arranged at positions corresponding to base angles. As described above, the first electrode 83 is grounded while the second and the third electrodes 85 and 87 are connected to the a.c. power supply 97 through the resistors 93 and 95, respectively. The second and the third electrodes 85 and 87 are applied from the a.c. power supply 97 through the resistors 93 and 95 with a driving voltage as an excitation voltage having a frequency substantially equal to the resonant frequency of the piezoelectric plate 53 in the thickness-shear . vibration mode. In this event, first primary thickness-shear vibration in the energy-trapping vibration mode is caused in a region surrounded by the first, the second, and the third electrodes 83, 85, and 87 along a straight line connecting the centers of the first and the second electrodes 83 and 85. Simultaneously, second primary thickness-shear vibration in the energy-trapping vibration mode is caused along another straight line connecting the centers of the first and the third electrodes 83 and 87. The first and the second primary thickness-shear vibrations are combined to form a resultant combined primary thickness-shear vibration in the energy-trapping vibration mode in a direction along a straight line (which is shown by a chain line in FIG. 10) between the center of the first electrode 83 and a midpoint between the centers of the second and the third electrodes 85 and 87. In this state, the piezoelectric plate 53 is rotated around an axis perpendicular to the principal surfaces thereof. Then, by the action of Coriolis force, secondary thickness-shear vibration is caused in a direction perpendicular to the combined primary thickness-shear vibration. The secondary thickness-shear vibration changes the impedances between the first and the second electrodes 83 and 85 and between the first and the third electrodes 83 and 87. As a result, terminal voltages of the second and the third electrodes 85 and 87 are changed. The impedance is changed in proportion to the rotational angular velocity applied to the piezoelectric vibrator 81 as far as the excitation voltage is constant.

A differential voltage between the terminal voltages of the second and the third electrodes 85 and 87 is detected by the differential amplifier circuit 77 and subjected to synchronous detection at a predetermined timing. Thus, an output voltage proportional to the applied rotational angular velocity applied to the piezoelectric vibrator 81 can be obtained.

In the third embodiment also, it is important to excite pure energy-trapping vibration without any spurious vibration in the region where the electrodes are faced to one another. This is also attained by polarizing in a thickness direction only the neighborhood of the region of the piezoelectric plate 53,where the first through the third electrodes 83, 85, and 87 are formed, if the piezoelectric plate 53 is made of a piezoelectric ceramics material.

The piezoelectric vibratory gyroscope according to the third embodiment described above has various advantages. Specifically, the piezoelectric vibratory gyroscope is simple in structure and therefore small in size. Input and output terminals can be connected without using a lead wire. Gyro characteristics are substantially free from influence of the support and fixing structure. Secure and reliable support is insured and antivibration and antishock characteristics are excellent.

What is claimed is:

1. A piezoelectric vibratory gyroscope utilizing an energy-trapping vibration mode, comprising:
   a piezoelectric plate having first and second principal surfaces opposite to each other, said piezoelectric plate being polarized in a thickness direction thereof;
   at least one driving electrode, formed on said first principal surface of said piezoelectric plate, for exciting said energy-trapping vibration mode of said piezoelectric plate when said driving electrode is applied with an exciting voltage; and
   output electrodes, also formed on said first principal surface of said piezoelectric plate, for detecting an output voltage induced by a Coriolis force caused by rotation of said piezoelectric plate around an axis perpendicular to the principal surfaces of said piezoelectric plate during a time when said energy-trapping vibration mode of said piezoelectric plate is being excited;

wherein said at least one driving electrode and said output electrodes comprise first through n-th electrodes, where n is an integer not smaller than three, formed in a generally central area of said first principal surface of said piezoelectric plate at positions corresponding to first through nth vertexes of a polygon having n angles, and said at least one driving electrode and said output electrodes being formed at a portion of said first principal surface of said piezoelectric plate which is not in a neighborhood of edges of said first principal surface of said piezoelectric plate.

2. A piezoelectric vibratory gyroscope as claimed in claim 1, wherein said energy-trapping vibration mode is a thickness-shear mode of the piezoelectric plate.

3. A piezoelectric vibratory gyroscope as claimed in claim 2, wherein each of said principal surfaces of said piezoelectric plate has a square shape.

4. A piezoelectric vibratory gyroscope as claimed in claim 2, wherein each of said principal surfaces of said piezoelectric plate has a rectangular shape.

5. A piezoelectric vibratory gyroscope as claimed in claim 4, further comprising a resin layer fixing said piezoelectric plate and leaving a region around said at least one driving electrode and said output electrodes as a hollow.

6. A piezoelectric vibratory gyroscope as claimed in claim 3, further comprising a resin layer fixing said piezoelectric plate and leaving a region around said at least one driving electrode and said output electrodes as a hollow.

7. A piezoelectric vibratory gyroscope as claimed in claim 1, wherein:

n is four so that first, second, third, and fourth electrodes are formed in said generally central area, and so that said polygon is a rectangle having two diagonals perpendicular to each other;

a first electrode pair is defined by said first and said third electrodes opposite to each other along one of said two diagonals; and a second electrode pair is defined by said second and said fourth electrodes opposite to each other along the other of said two diagonals.

8. A piezoelectric vibratory gyroscope as claimed in claim 1, wherein:

said piezoelectric plate is made of a piezoelectric material; and said piezoelectric plate is polarized in the thickness direction thereof only in a neighborhood of said generally central area at which said first through n-th electrodes are formed.

9. A piezoelectric vibratory gyroscope as claimed in claim 1, wherein n is three so that first, second and third electrodes are formed in said generally central area, and said polygon is an isosceles triangle with said first electrode being formed at a position corresponding to a top angle of said isosceles triangle and said second and said third electrodes being formed at positions corresponding to base angles of said isosceles triangle.

10. A piezoelectric vibratory gyroscope as claimed in claim 9, wherein:

said second and third electrodes are connected to a common connection point through registers;

said at least one driving electrode comprises said first through third electrodes so that the exciting voltage is applied between said first electrode and said common connection point; and said output voltage is detected as a differential voltage between said second and said third electrodes.

11. A piezoelectric vibratory gyroscope as claimed in claim 10, wherein said first electrode is coupled to a ground potential.

12. A piezoelectric vibratory gyroscope as claimed in claim 11, wherein:

said piezoelectric plate is made of a piezoelectric ceramics material; and said piezoelectric plate is polarized in the thickness direction thereof only in a neighborhood of said generally central area at which said first, second and third electrodes are formed.

13. A piezoelectric vibratory gyroscope as claimed in claim 9, wherein:

said first electrode serves as said at least one driving electrode; and said second and third electrodes serve as said output electrodes.

14. A piezoelectric vibratory gyroscope as claimed in claim 13, wherein:

said second and third electrodes are connected to first and second current detection circuits having a virtual grounding function, respectively;

said driving electrode excites vibration of said piezoelectric plate to extract a differential voltage between output voltages of said first and said second current detection circuits; and said differential voltage is detected to produce an output of said gyroscope.

15. A piezoelectric vibratory gyroscope as claimed in claim 14, wherein:

said piezoelectric plate is made of a piezoelectric ceramics material; and said piezoelectric plate is polarized in the thickness direction thereof only in a neighborhood of said generally central area at which said first, second and third electrodes are formed.

* * * * *